(12) United States Patent
Chen

(10) Patent No.: US 7,196,358 B1
(45) Date of Patent: Mar. 27, 2007

(54) LIGHT EMITTING DIODE MODULE WITH HIGH HEAT DISSIPATION

(75) Inventor: Hsing Chen, HsinChu (TW)

(73) Assignee: Solidlite Corporation, Hsinchu (TW)

( * ) Notice: Subject to any disclaimer, the term of this patent is extended or adjusted under 35 U.S.C. 154(b) by 0 days.

(21) Appl. No.: 11/286,669

(22) Filed: Nov. 25, 2005

(51) Int. Cl.
*H01L 21/00* (2006.01)

(52) U.S. Cl. .......................................... 257/98; 257/99

(58) Field of Classification Search ................. 257/98, 257/99, 100; 313/502
See application file for complete search history.

(56) References Cited

U.S. PATENT DOCUMENTS 6,835,960 B2 * 12/2004 Lin et al. ..................... 257/81
7,053,414 B2 * 5/2006 Su et al. ....................... 257/81

* cited by examiner

*Primary Examiner*—Hoai Pham
(74) *Attorney, Agent, or Firm*—Pro-Techtor Int'l Services

(57) ABSTRACT

A light emitting diode with high heat dissipation includes a substrate, a LED chip, a metal light reflection layer, a first lens, a holder, and a second lens. The substrate has an upper surface formed with a positive electrode and an opposite electrode, and a lower surface opposite to the upper surface. The LED chip is arranged on the upper surface of the substrate, and is electrically connected to the positive electrode and the opposite electrode by wires. The metal light reflection layer is located on the upper surface of the substrate for surrounding the LED chip, and reflecting the light emitted from the LED chip. The first lens is mounted on the metal light reflection layer for encapsulating the LED chip. The holder is mounted on the substrate to cover the first lens. And the second lens arranged on the holder.

6 Claims, 4 Drawing Sheets

LIGHT EMITTING DIODE MODULE WITH HIGH HEAT DISSIPATION

BACKGROUND OF THE INVENTION

1. Field of the Invention

The invention relates to a light emitting diode module with high heat dissipation, and in particular to a light emitting diode that is easy to be fabricated and capable of increasing lifetime of the product.

2. Description of the Related Art

A light emitting diode is disclosed in U.S. Pat. No. 6,204,523, which includes a bottom base, a LED chip, a body, and a lens. The LED chip is mounted on the cavity of the bottom base, then, the body is integrated with the bottom base. The LED chip is electrically connected to the leadframe of the body by wires. The lens is covered on the body to finish the LED package.

Because of the poor thermal conductivity of the bottom base and body, the heat energy generated by LED chip when applied a higher current may not be dissipated. Thus, the conventional light emitting diode may not be manufactured to obtain higher current.

It is very important how to obtain high heat dissipation LED, and in particular to a white light emitting diode that may be produced to generate higher heat energy, therefore, the heat dissipation effect is very important.

SUMMARY OF THE INVENTION

An objective of the invention is to provide a light emitting diode module with high heat dissipation to prolong its durability and lifetime effectively.

Another objective of the invention is to provide a light emitting diode module with high heat dissipation that is easy to be fabricated.

To achieve the above-mentioned objective, the invention includes a metal substrate, a LED chip, a metal light reflection layer, and a first lens, a holder, and a second lens. The substrate has an upper surface formed with a positive electrode and an opposite electrode, and a lower surface opposite to the upper surface. The LED chip is arranged on the upper surface of the substrate, and is electrically connected to the positive electrode and the opposite electrode by wires. The metal light reflection layer is located on the upper surface of the metal substrate for surrounding the LED chip, and reflecting the light emitted from the LED chip. The lens is mounted on the metal light reflection layer for encapsulating the LED chip.

Therefore, the heat energy generated by LED chip when applied a higher current can be dissipated, so that the durability and lifetime of the light emitting diode can be prolonged effectively.

DETAILED DESCRIPTION OF THE INVENTION

Figure 1:
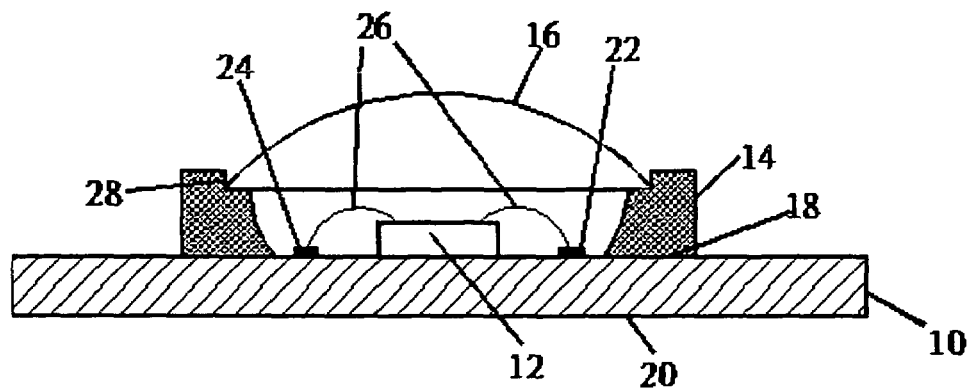
FIG. 1 is the first schematic illustration showing a light emitting diode module with high heat dissipation of the present invention.

Please refer to FIG. 1. It is first schematic illustration showing a light emitting diode with high heat dissipation of the present invention includes a metal substrate 10, a LED chip 12, a metal light reflection layer 14, and a lens 16.

The metal substrate 10 has an upper surface 18 formed with a positive electrode 22 and an opposite electrode 24, and a lower surface 20 opposite to the upper surface 18.

The LED chip 12 is arranged on the upper surface 18 of the metal substrate 10, and is electrically connected to the positive electrode 22 and the opposite electrode 24 by wires 26.

The metal light reflection layer 14 is formed of aluminum or copper, which is located on the upper surface 18 of the metal substrate 10 for surrounding the LED chip 12, and reflecting the light emitted from the LED chip 12.

The lens 16 is a convex, which is mounted on the metal light reflection layer 14 for encapsulating the LED chip 12.

In the embodiment, a plurality of chips 12 are arranged on the substrate 10, a plurality of metal light reflection layer 14 is located on the corresponding to chip 12, the lens 16 is mounted on the each of metal light reflection layer 14, then, cutting the substrate 12 to finish the single light emitting diode package.

Figure 2:
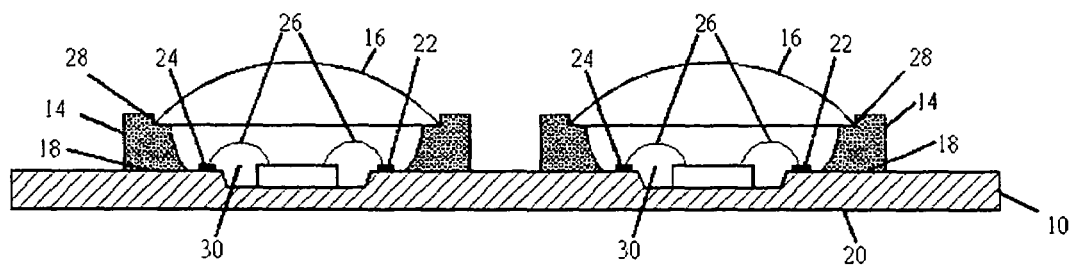
FIG. 2 is the second schematic illustration showing a light emitting diode module with high heat dissipation of the present invention.

Please refer to FIG. 2. It is second schematic illustration showing a light emitting diode with high heat dissipation of the present invention includes a metal substrate 10, a LED chip 12, a metal light reflection layer 14, and a first lens 16.

The metal substrate 10 has an upper surface 18 formed with a positive electrode 22, an opposite electrode 24, and a cavity 30, and a lower surface 20 opposite to the upper surface 18.

The LED chip 12 is arranged within the cavity 30 of the upper surface 18 of the metal substrate 10, and is electrically connected to the positive electrode 22 and the opposite electrode 24 by wires 26. Thus, the thickness of the light emitting diode may be reduced.

The metal light reflection layer 14 is formed of aluminum or copper, which is located on the upper surface 18 of the metal substrate 10 for surrounding the LED chip 12, and reflecting the light emitted from the LED chip 12. The top surface of the light reflection layer 14 is formed with depression 28 for locating the first lens.

The lens 16 is a convex, which is mounted on the depression 28 of the metal light reflection layer 14 for encapsulating the LED chip 12.

In the embodiment, a plurality of chips 12 are arranged on the substrate 10, a plurality of metal light reflection layer 14 is located on the corresponding to chip 12, the lens 16 is mounted on the each of metal light reflection layer 14, then, cutting the substrate 12 to finish the single light emitting diode package.

Figure 3:
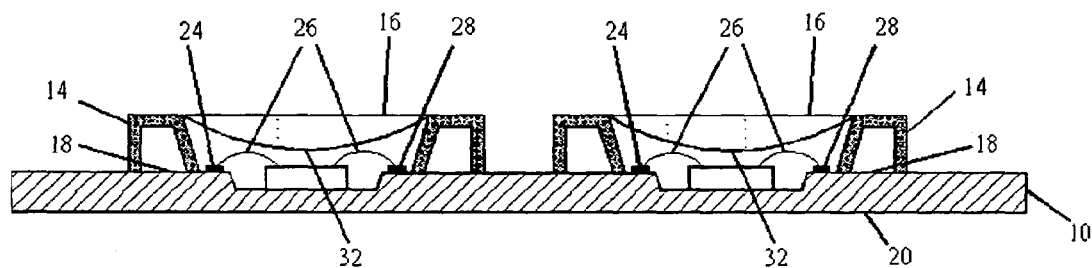
FIG. 3 is the third schematic illustration showing a light emitting diode module with high heat dissipation of the present invention.

Please refer to FIG. 3. It is third schematic illustration showing a light emitting diode with high heat dissipation of the present invention includes a metal substrate 10, a LED chip 12, a metal light reflection layer 14, and a first lens 16.

The metal substrate 10 has an upper surface 18 formed with a positive electrode 22, an opposite electrode 24, and a cavity 30, and a lower surface 20 opposite to the upper surface 18.

The LED chip 12 is arranged on the cavity 30 of the upper surface 18 of the metal substrate 10, and is electrically connected to the positive electrode 22 and the opposite electrode 24 by wires 26. Thus, the thickness of the light emitting diode may be reduced.

The metal light reflection layer 14 and lens 16 are integrated, which is located on the upper surface 18 of the metal substrate 10 for surrounding the LED chip 12, and metal reflecting the light emitted from the LED chip 12.

In the embodiment, a plurality of chips 12 are arranged on the substrate 10, a plurality of metal light reflection layer 14 is located on the corresponding to chip 12, the first lens 16 is mounted on the each of metal light reflection layer 14, then, cutting the substrate 12 to finish the single light emitting diode package.

Figure 4:
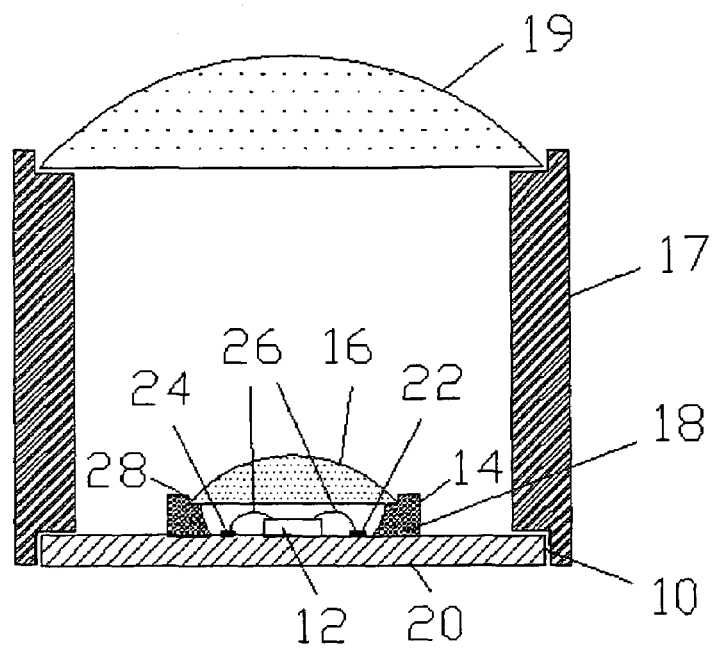
FIG. 4 is the cross-sectional illustration showing a light emitting diode module with high heat dissipation of the present invention.
Figure 5:
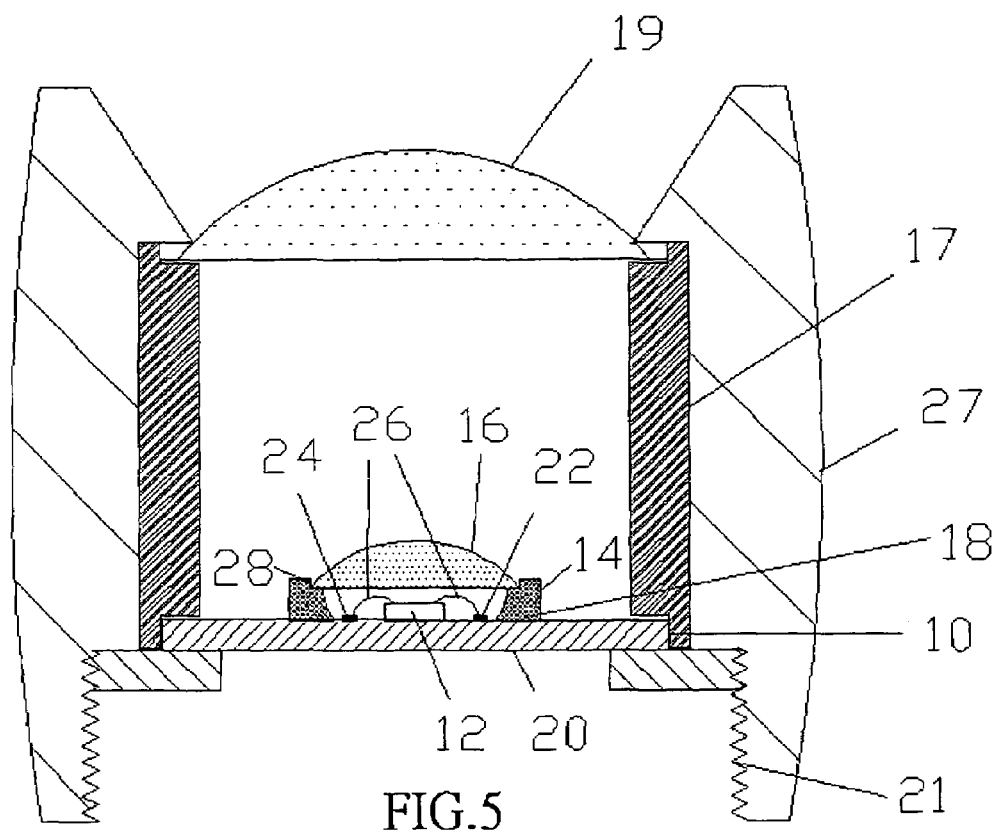
FIG. 5 is a schematic illustration showing a light emitting diode module with high heat dissipation of the present invention.
Figure 6:
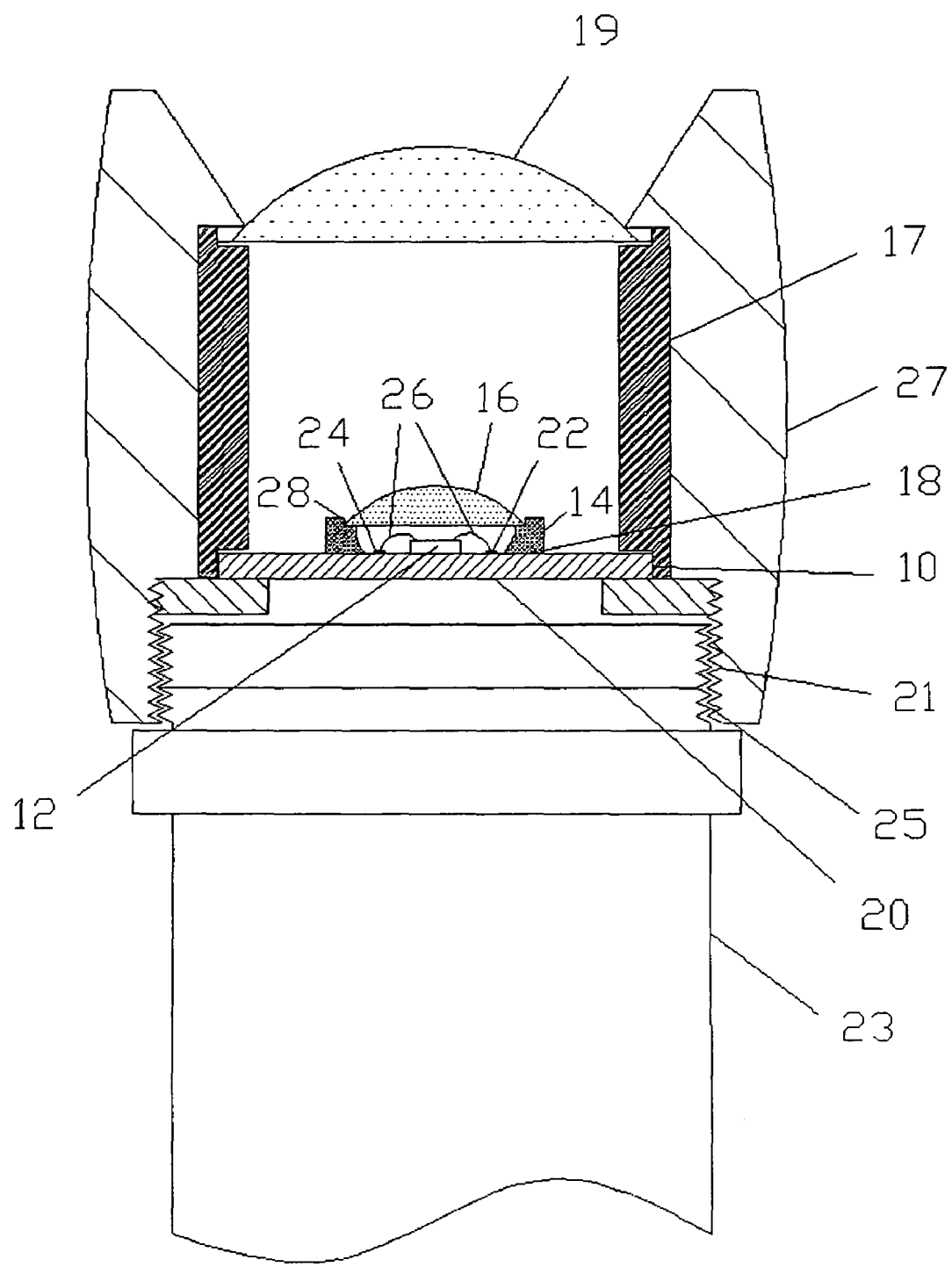
FIG. 6 is another a schematic illustration showing a light emitting diode module with high heat dissipation of the present invention.

Please refer to FIG. 4. It is a schematic illustration showing a light emitting diode module with high heat dissipation of the present invention includes a metal substrate 10, a LED chip 12, a metal light reflection layer 14, a first lens 16, a holder 17, and a second lens 19.

The metal substrate 10 has an upper surface 18 formed with a positive electrode 22 and an opposite electrode 24, and a lower surface 20 opposite to the upper surface 18.

The LED chip 12 is arranged on the upper surface 18 of the metal substrate 10, and is electrically connected to the positive electrode 22 and the opposite electrode 24 by wires 26.

The metal light reflection layer 14 is formed of aluminum or copper, which is located on the upper surface 18 of the metal substrate 10 for surrounding the LED chip 12, and reflecting the light emitted from the LED chip 12.

The first lens 16 is a convex, which is mounted on the metal light reflection layer 14 for encapsulating the LED chip 12.

The holder 17 is mounted on the substrate 10 to cover the first lens 16.

The second lens 19 is arranged on the holder 17 to cover the first lens 16.

Please refer to FIG. 3 and FIG. 4, the holder 17 is mounted into the body 27, which is formed with a internal thread 21. The internal thread 21 of the body 27 is screwed on the external thread of 25 of the shell 23 of the blowlamp.

The present invention has the following advantages.

1. The heat energy generated by LED chip 12 may be dissipated through the metal substrate 10 and the metal light reflection layer 14, so that the durability and lifetime of the light emitting diode may be prolonged effectively.
2. The LED chip 12 is arranged within the cavity 30 of the substrate 10. Thus, the thickness of the light emitting diode may be reduced.

While the invention has been described by the way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A light emitting diode module with high heat dissipation, the light emitting diode module comprising:
    a substrate having an upper surface formed with a positive electrode and an opposite electrode and a lower surface opposite to the upper surface;
    a LED chip arranged on the upper surface of the substrate, and electrically connected to the positive electrode and the opposite electrode by wires;
    a metal light reflection layer located on the upper surface of the substrate for surrounding the LED chip, and reflecting the light emitted from the LED chip;
    a first lens mounted on the light reflection layer for encapsulating the LED chip;
    a holder mounted on the substrate to cover the first lens; and
    a second lens arranged on the holder.
2. The light emitting diode module with high heat dissipation according to claim 1, wherein the metal light reflection layer is form of aluminum or copper.
3. The light emitting diode module with high heat dissipation according to claim 1, wherein the upper surface of the substrate is formed with a cavity for mounting the LED chip.
4. The light emitting diode module with high heat dissipation according to claim 1, wherein metal light reflection layer is formed with a depression for locating the first lens.
5. The light emitting diode module with high heat dissipation according to claim 1, wherein the substrate is formed of metal.
6. The light emitting diode module with high heat dissipation according to claim 1, wherein comprises a body formed with an internal thread, the holder is mounted into the body, so that the body is screwed on the external thread of shell of a blowlamp.

\* \* \* \* \*